US009830970B2

(12) United States Patent
Meade

(10) Patent No.: US 9,830,970 B2
(45) Date of Patent: *Nov. 28, 2017

(54) CROSS-POINT MEMORY CELLS, NON-VOLATILE MEMORY ARRAYS, METHODS OF READING A MEMORY CELL, METHODS OF PROGRAMMING A MEMORY CELL, METHODS OF WRITING TO AND READING FROM A MEMORY CELL, AND COMPUTER SYSTEMS

(71) Applicant: Micron Technology, Inc., Boise, ID (US)

(72) Inventor: Roy E. Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/237,434

(22) Filed: Aug. 15, 2016

(65) Prior Publication Data

US 2016/0358641 A1    Dec. 8, 2016

Related U.S. Application Data

(63) Continuation of application No. 14/557,306, filed on Dec. 1, 2014, now Pat. No. 9,419,215, which is a
(Continued)

(51) Int. Cl.
*G11C 11/24*    (2006.01)
*G11C 8/08*    (2006.01)
(Continued)

(52) U.S. Cl.
CPC ............... *G11C 11/24* (2013.01); *G11C 8/08* (2013.01); *G11C 11/34* (2013.01); *G11C 11/56* (2013.01);
(Continued)

(58) Field of Classification Search
CPC .................. G11C 11/24; G11C 8/08
(Continued)

(56) References Cited

U.S. PATENT DOCUMENTS 4,094,008 A * 6/1978 Lockwood .............. G11C 11/24
 257/324
4,242,736 A   12/1980 Raffel et al.
(Continued)

FOREIGN PATENT DOCUMENTS

CN    1345069    4/2002
CN    101053039    10/2007
(Continued)

OTHER PUBLICATIONS

"What is a Memristor?", URL http://www.coolestanswers.com/science-technology/what-is-a-memristor.html, Oct. 19, 2008, 2 pages.
(Continued)

*Primary Examiner* — Michael Tran
(74) *Attorney, Agent, or Firm* — Wells St. John P.S.

(57) ABSTRACT

Cross-point memory cells, non-volatile memory arrays, methods of reading a memory cell, methods of programming a memory cell, and methods of writing to and reading from a memory cell are described. In one embodiment, a cross-point memory cell includes a word line extending in a first direction, a bit line extending in a second direction different from the first direction, the bit line and the word line crossing without physically contacting each other, and a capacitor formed between the word line and the bit line where such cross. The capacitor comprises a dielectric material configured to prevent DC current from flowing from the word line to the bit line and from the bit line to the word line.

28 Claims, 11 Drawing Sheets

Related U.S. Application Data continuation of application No. 13/841,181, filed on Mar. 15, 2013, now Pat. No. 8,902,639, which is a continuation of application No. 12/705,918, filed on Feb. 15, 2010, now Pat. No. 8,416,609.

(51) Int. Cl.
| | | |
|---|---|---|
| *G11C 13/00* | (2006.01) | |
| *G11C 11/56* | (2006.01) | |
| *H01L 27/10* | (2006.01) | |
| *H01L 49/02* | (2006.01) | |
| *G11C 11/34* | (2006.01) | |
| *H01L 45/00* | (2006.01) | |

(52) U.S. Cl.
CPC ........ *G11C 11/565* (2013.01); *G11C 11/5685* (2013.01); *G11C 13/0002* (2013.01); *G11C 13/004* (2013.01); *G11C 13/0007* (2013.01); *G11C 13/0011* (2013.01); *G11C 13/0061* (2013.01); *G11C 13/0069* (2013.01); *H01L 27/101* (2013.01); *H01L 28/40* (2013.01); *H01L 45/08* (2013.01); *H01L 45/12* (2013.01); *H01L 45/1233* (2013.01)

(58) Field of Classification Search
USPC ............................................ 365/149, 230.06
See application file for complete search history.

(56) References Cited

U.S. PATENT DOCUMENTS

| | | | |
|---|---|---|---|
| 4,250,568 A | 2/1981 | Grassl | |
| 4,947,376 A | 8/1990 | Arimoto et al. | |
| 5,161,121 A | 11/1992 | Cho | |
| 5,736,420 A | 4/1998 | Min et al. | |
| 5,917,744 A | 6/1999 | Kirihata et al. | |
| 6,317,375 B1 | 11/2001 | Perner | |
| 6,380,056 B1 | 4/2002 | Shue et al. | |
| 6,438,022 B2 | 8/2002 | Schlosser et al. | |
| 6,518,589 B2 | 2/2003 | King | |
| 6,559,470 B2 | 5/2003 | Tsu-Jae | |
| 6,657,882 B2 | 12/2003 | Takashima | |
| 6,670,659 B1 | 12/2003 | Gudesen et al. | |
| 6,864,529 B2 | 3/2005 | Mei et al. | |
| 6,887,792 B2 | 5/2005 | Perlov et al. | |
| 6,999,854 B2 | 2/2006 | Roth | |
| 7,009,278 B2 | 3/2006 | Hsu | |
| 7,031,180 B2 | 4/2006 | Karasawa et al. | |
| 7,037,731 B2 | 5/2006 | Kijima et al. | |
| 7,075,839 B2 * | 7/2006 | Mukunoki ............. | G11C 29/12 365/185.26 |
| 7,102,914 B2 | 9/2006 | Chen et al. | |
| 7,110,281 B1 | 9/2006 | Voogel et al. | |
| 7,161,838 B2 | 1/2007 | Mei et al. | |
| 7,177,135 B2 | 2/2007 | Kim et al. | |
| 7,196,926 B1 | 3/2007 | Kim | |
| 7,255,941 B2 | 8/2007 | Kijima et al. | |
| 7,272,060 B1 | 9/2007 | Lu et al. | |
| 7,302,513 B2 | 11/2007 | Mouttet | |
| 7,327,596 B2 | 2/2008 | Ebihara et al. | |
| 7,342,413 B2 | 3/2008 | Mouttet | |
| 7,365,382 B2 | 4/2008 | Willer et al. | |
| 7,371,473 B2 | 5/2008 | Kijima et al. | |
| 7,378,870 B2 | 5/2008 | Mouttet | |
| 7,391,235 B2 | 6/2008 | Mouttet | |
| 7,426,128 B2 | 9/2008 | Scheuerlein | |
| 7,435,648 B2 | 10/2008 | Hsu et al. | |
| 7,443,710 B2 | 10/2008 | Fang et al. | |
| 7,447,828 B2 | 11/2008 | Mouttet | |
| 7,449,354 B2 | 11/2008 | Marchant et al. | |
| 7,459,933 B2 | 12/2008 | Mouttet | |
| 7,482,223 B2 | 1/2009 | Higashitani et al. | |
| 7,564,262 B2 | 7/2009 | Mouttet | |
| 7,576,565 B2 | 8/2009 | Mouttet | |
| 7,592,659 B2 | 9/2009 | Isogai | |
| 7,609,086 B2 | 10/2009 | Mouttet | |
| 7,626,678 B2 | 12/2009 | Lin et al. | |
| 7,696,506 B2 | 4/2010 | Lung | |
| 7,723,771 B2 | 5/2010 | Boescke et al. | |
| 7,755,424 B2 | 7/2010 | Mouttet | |
| 7,763,880 B2 | 7/2010 | Williams | |
| 7,778,082 B2 | 8/2010 | Shin et al. | |
| 7,812,404 B2 | 10/2010 | Herner et al. | |
| 7,902,867 B2 | 3/2011 | Mouttet | |
| 7,965,539 B2 | 6/2011 | Osano et al. | |
| 7,983,065 B2 | 7/2011 | Samachisa | |
| 8,094,485 B2 | 1/2012 | Shimakawa et al. | |
| 8,183,553 B2 | 5/2012 | Phatak et al. | |
| 8,199,556 B2 | 6/2012 | Srinivasan et al. | |
| 8,223,539 B2 | 7/2012 | Smythe et al. | |
| 8,249,838 B2 | 8/2012 | Pino et al. | |
| 8,259,489 B2 | 9/2012 | Nagashima et al. | |
| 8,294,219 B2 | 10/2012 | Malhotra et al. | |
| 8,405,124 B2 | 3/2013 | Karg et al. | |
| 8,416,609 B2 | 4/2013 | Meade | |
| 8,437,174 B2 | 5/2013 | Meade et al. | |
| 8,537,599 B2 | 9/2013 | Srinivasan et al. | |
| 8,547,727 B2 | 10/2013 | Wu et al. | |
| 8,575,585 B2 | 11/2013 | Yang et al. | |
| 8,634,224 B2 | 1/2014 | Srinivasan et al. | |
| 8,867,261 B2 | 10/2014 | Meade et al. | |
| 8,872,246 B1 | 10/2014 | Stevens et al. | |
| 8,902,639 B2 | 12/2014 | Meade | |
| 9,040,948 B2 | 5/2015 | Ribeiro et al. | |
| 9,236,473 B2 | 1/2016 | Meade et al. | |
| 9,275,728 B2 | 3/2016 | Srinivasan et al. | |
| 9,419,215 B2 | 8/2016 | Meade | |
| 2001/0019147 A1 | 9/2001 | De Boer et al. | |
| 2002/0034101 A1 | 3/2002 | Semi | |
| 2002/0084480 A1 | 7/2002 | Basceri et al. | |
| 2003/0045037 A1 | 3/2003 | Mei et al. | |
| 2003/0179617 A1 | 9/2003 | Gudesen et al. | |
| 2004/0022090 A1 | 2/2004 | Hasegawa et al. | |
| 2004/0065912 A1 | 4/2004 | Liu et al. | |
| 2004/0214352 A1 | 10/2004 | Kijima et al. | |
| 2004/0218441 A1 | 11/2004 | Schwarzl | |
| 2004/0227176 A1 | 11/2004 | York | |
| 2004/0229384 A1 | 11/2004 | Kijima et al. | |
| 2004/0246768 A1 | 12/2004 | Krieger et al. | |
| 2005/0134294 A1 | 6/2005 | Ebihara | |
| 2005/0157547 A1 | 7/2005 | Mei et al. | |
| 2006/0022245 A1 | 2/2006 | Jeong | |
| 2006/0022325 A1 | 2/2006 | Hwang et al. | |
| 2006/0083933 A1 | 4/2006 | Kijima et al. | |
| 2006/0088731 A1 | 4/2006 | Kijima et al. | |
| 2006/0097288 A1 | 5/2006 | Baek et al. | |
| 2006/0131627 A1 | 6/2006 | Kondo et al. | |
| 2006/0171200 A1 | 8/2006 | Rinerson et al. | |
| 2006/0223251 A1 | 10/2006 | Isogai | |
| 2007/0097743 A1 * | 5/2007 | Fang .................. | G11C 16/0416 365/185.05 |
| 2007/0117315 A1 | 5/2007 | Lai et al. | |
| 2007/0133259 A1 * | 6/2007 | Kim .................. | G11C 8/10 365/149 |
| 2007/0205449 A1 * | 9/2007 | Ishida ............... | H01L 27/11502 257/295 |
| 2007/0217252 A1 | 9/2007 | Symanczyk | |
| 2007/0229111 A1 | 10/2007 | Mouttet | |
| 2007/0229112 A1 | 10/2007 | Mouttet | |
| 2007/0229121 A1 | 10/2007 | Mouttet | |
| 2007/0231972 A1 | 10/2007 | Mouttet | |
| 2007/0241942 A1 | 10/2007 | Mouttet | |
| 2007/0257704 A1 | 11/2007 | Mouttet | |
| 2007/0267675 A1 | 11/2007 | Cho et al. | |
| 2008/0001172 A1 | 1/2008 | Karg et al. | |
| 2008/0048186 A1 | 2/2008 | Cheng et al. | |
| 2008/0059688 A1 | 3/2008 | Mouttet | |
| 2008/0079029 A1 | 4/2008 | Williams | |
| 2008/0090337 A1 | 4/2008 | Williams | |
| 2008/0106926 A1 | 5/2008 | Brubaker et al. | |
| 2008/0130366 A1 * | 6/2008 | Ueda .................. | G11C 8/10 365/185.13 |
| 2008/0172385 A1 | 7/2008 | Mouttet | |

(56) References Cited

U.S. PATENT DOCUMENTS

| | | | |
|---|---|---|---|
| 2008/0192526 A1* | 8/2008 | Weis | G11O 5/063 |
| | | | 365/63 |
| 2008/0212382 A1 | 9/2008 | Mouttet | |
| 2008/0222342 A1 | 9/2008 | Mouttet | |
| 2008/0246116 A1 | 10/2008 | Mouttet | |
| 2008/0278990 A1 | 11/2008 | Kumar et al. | |
| 2008/0307151 A1 | 12/2008 | Mouttet | |
| 2009/0020740 A1 | 1/2009 | Chien et al. | |
| 2009/0026435 A1 | 1/2009 | Kakegawa | |
| 2009/0122602 A1 | 5/2009 | Takemura et al. | |
| 2009/0163826 A1 | 6/2009 | Mouttet | |
| 2009/0206051 A1 | 8/2009 | Das | |
| 2009/0207681 A1 | 8/2009 | Juengling | |
| 2009/0230507 A1 | 9/2009 | Riess | |
| 2009/0244953 A1 | 10/2009 | Maejima | |
| 2009/0279343 A1 | 11/2009 | Chang et al. | |
| 2009/0289290 A1 | 11/2009 | Huang et al. | |
| 2010/0034010 A1 | 2/2010 | Xi et al. | |
| 2010/0039850 A1* | 2/2010 | Kitazaki | G11C 11/22 |
| | | | 365/145 |
| 2010/0078620 A1 | 4/2010 | Xi et al. | |
| 2010/0128512 A1 | 5/2010 | Ohnishi et al. | |
| 2010/0164324 A1 | 7/2010 | Kim | |
| 2010/0320547 A1 | 12/2010 | Ando et al. | |
| 2011/0051310 A1 | 3/2011 | Stachan et al. | |
| 2011/0182108 A1* | 7/2011 | Williams | G11C 13/02 |
| | | | 365/148 |
| 2011/0186801 A1 | 8/2011 | Yang et al. | |
| 2011/0199814 A1 | 8/2011 | Meade | |
| 2011/0199815 A1 | 8/2011 | Meade et al. | |
| 2011/0221038 A1* | 9/2011 | Mathai | H01L 45/145 |
| | | | 257/608 |
| 2011/0240941 A1 | 10/2011 | Pickett et al. | |
| 2011/0261606 A1 | 10/2011 | Sandhu et al. | |
| 2011/0266515 A1 | 11/2011 | Pickett et al. | |
| 2012/0012809 A1* | 1/2012 | Yang | H01L 27/101 |
| | | | 257/4 |
| 2012/0014170 A1* | 1/2012 | Strukov | G11C 11/24 |
| | | | 365/149 |
| 2012/0032134 A1 | 2/2012 | Yang et al. | |
| 2012/0039109 A1 | 2/2012 | Srinivasan et al. | |
| 2012/0039114 A1* | 2/2012 | Bratkovski | G11C 11/24 |
| | | | 365/149 |
| 2012/0063192 A1 | 3/2012 | Lee | |
| 2012/0104346 A1 | 5/2012 | Yi et al. | |
| 2012/0133026 A1 | 5/2012 | Yang et al. | |
| 2013/0001498 A1 | 1/2013 | Srinivasan et al. | |
| 2013/0002634 A1 | 1/2013 | Wendler et al. | |
| 2013/0082229 A1 | 4/2013 | Chen | |
| 2013/0208532 A1 | 8/2013 | Meade | |
| 2013/0221419 A1 | 8/2013 | Meade et al. | |
| 2013/0223134 A1 | 8/2013 | Yi et al. | |
| 2014/0104932 A1 | 4/2014 | Srinivasan et al. | |
| 2014/0246671 A1 | 9/2014 | Meade et al. | |
| 2015/0085565 A1 | 3/2015 | Meade | |

FOREIGN PATENT DOCUMENTS

| | | |
|---|---|---|
| CN | 101075629 | 11/2007 |
| CN | 101258600 | 9/2008 |
| CN | 101300678 | 11/2008 |
| CN | 101548403 | 9/2009 |
| CN | 201180009631.4 | 4/2014 |
| CN | 201180039043.5 | 1/2015 |
| CN | 201180009465.8 | 3/2015 |
| EP | 11 74 2625 | 6/2013 |
| EP | 11 81 6751 | 7/2015 |
| JP | H03-044972 | 2/1991 |
| JP | H03-104285 | 5/1991 |
| JP | 2006-093736 | 4/2006 |
| JP | 2006-176366 | 7/2006 |
| JP | 2006-188427 | 7/2006 |
| JP | 2006-245280 | 9/2006 |
| JP | 2008-258623 | 10/2008 |
| JP | 4383523 | 12/2009 |
| JP | 2003-152118 | 3/2015 |
| TW | 200616086 | 5/2006 |
| TW | 200636929 | 10/2006 |
| TW | 200805376 | 1/2008 |
| TW | 200912932 | 3/2009 |
| TW | 100104801 | 7/2013 |
| TW | 100104805 | 4/2014 |
| TW | 100126468 | 10/2014 |
| TW | 102136626 | 5/2015 |
| WO | WO 2006/029228 | 3/2006 |
| WO | WO 2008/108822 | 9/2008 |
| WO | WO 2010/068221 | 6/2010 |
| WO | WO 2010/144092 | 12/2010 |
| WO | WO 2010/147588 | 12/2010 |
| WO | WO PCT/US2011/023190 | 10/2011 |
| WO | WO PCT/US2011/022390 | 8/2012 |
| WO | WO PCT/US2011/023190 | 8/2012 |
| WO | WO PCT/US2011/043504 | 2/2013 |

OTHER PUBLICATIONS

Adee, Sally, "The Mysterious Memristor", URL http://spectrum.ieee.org/semiconductors/design/the-mysterious-memristor, May 2008, 4 pages.

Anonymous, "The Business Landscape for Memristor Electronics", URL: http://knol.google.com/k/the-business-landscape-for-memristor-electronics#, Nov. 8, 2009, 12 pages.

Anonymous; "An Introduction to Memimpedance and Memadmittance Systems Analysis", http://knol.google.com/k/an-introduction-to-memimpedance-and-memadmittance-systems-analysis#, Nov. 25, 2009, 21 pages.

Biolek et al., "SPICE Modeling of Memristive, Memcapacitative and Memiductive Systems", IEEE European Conference on Circuit Theory and Design, 2009, Turkey, pp. 249-252.

Chua et al., "Memristive Devices and System", Proceedings of the IEEE vol. 64, No. 2, Feb. 1976, United States, pp. 209-223.

Chua, "Memristor—The Missing Circuit Element", IEEE Transactions on Circuit Theory vol. CT-18, No. 5, Sep. 1971, United States, pp. 507-519.

Chua, "Nonlinear Circuit Foundations for Nanodevices, Part I: The Four-Element Torus", Proceedings of the IEEE vol. 91, No. 11, 2003, United States, pp. 1830-1859.

Di Ventra et al., "Circuit Elements With Memory: Memristors, Memcapacitors,and Meminductors", Proceedings of the IEEE vol. 97, No. 10, Oct. 2009, United States, pp. 1717-1724.

Di Ventra et al., "Putting Memory Into Circuit Elements: Memristors, Memcapacitors and Meminductors", Proceedings of the IEEE vol. 97, No. 8, Aug. 2009, United States, pp. 1371-1372.

Di Ventura et al., "Circuit Elements with Memory: Memristors, Memcapacitors and Meminductors", Proceedings of the IEEE vol. 97, No. 10, Jan. 23, 2009, United States, pp. 1-6.

HP Labs, "HP Memristor FAQ", URL http://www.hpl.hp.com/news/2008/apr-jun/memristor_faq.html, 2008, 3 pages.

Lai et al., "Analog Memory Capacitor Based on Field-Configurable Ion-Doped Polymers", Applied Physics Letters vol. 95, No. 21, Nov. 2009, United States, pp. 213503-213503-3.

Liu et al., "Electric-Pulse-Induced Capacitance Change Effect in Perovskite Oxide Thin Films", Journal of Applied Physics vol. 100, No. 5, Sep. 2006, United States, pp. 56101-1 through 56101-3.

Meyer et al., "Oxide Dual-Layer Memory Element for Scalable Non-Volatile Cross-Point Memory Technology", 9th Annual IEEE Non-Volatile Memory Technology Symposium 2008, United States, pp. 1-5.

Pershin et al., "Experimental Demonstration of Associative Memory with Memristive Neural Networks", Neural Networks: The Official Journal of the International Neural Network Society, Sep. 18, 2009, United States, pp. 1-5.

(56) References Cited

OTHER PUBLICATIONS

Pershin et al., "Memristive Circuits Simulate Memcapacitors and Meminductors", Electronics Letters vol. 46, No. 7, Oct. 8, 2009, United Kingdom, pp. 1-2.
Strukov et al., "Coupled Ionic And Electronic Transport Model Of Thin-Film Semiconductor Memristive Behavior", Small vol. 5, No. 9, 2009, Germany, pp. 1058-1063.
Strukov et al., "Exponential Ionic Drift: Fast Switching and Low Volatility of Thin-Film Memristors", Applied Physics A (94), Nov. 28, 2008, pp. 515-519.
Strukov et al., "The Missing Memristor Found", Nature Letters vol. 453, May 1, 2008, United Kingdom, pp. 80-83,
Wakefield et al., "Titanium Dioxide as Gate Insulator for M.O.S. Transistors", Electronic Letters vol. 6, No. 16, Aug. 6, 1970, pp. 507-508.
Winkler et al., "Floating Nano-Dot MOS Capacitor Memory Arrays Without Cell Transistors", Microelectronic Engineering vol. 73-74, Elsevier Publishers BV., Amsterdam, Mar. 19, 2004, pp. 719-724.

\* cited by examiner

CROSS-POINT MEMORY CELLS, NON-VOLATILE MEMORY ARRAYS, METHODS OF READING A MEMORY CELL, METHODS OF PROGRAMMING A MEMORY CELL, METHODS OF WRITING TO AND READING FROM A MEMORY CELL, AND COMPUTER SYSTEMS

RELATED PATENT DATA

This application is a continuation of and claims priority to U.S. patent application Ser. No. 14/557,306, which was filed Dec. 1, 2014, which issued as U.S. Pat. No. 9,419,215 on Aug. 16, 2016, which is a continuation of and claims priority to U.S. patent application Ser. No. 13/841,181, which was filed Mar. 15, 2013, which issued as U.S. Pat. No. 8,902,639 on Dec. 2, 2014, which is a continuation of and claims priority to U.S. patent application Ser. No. 12/705,918, which was filed on Feb. 15, 2010, which issued as U.S. Pat. No. 8,416,609 on Apr. 9, 2013, the teachings of which are incorporated herein by reference.

TECHNICAL FIELD

This invention relates to cross-point memory cells, to non-volatile memory arrays, to methods of reading a memory cell, to methods of programming a memory cell, to methods of writing to and reading from a memory cell, and to computer systems.

BACKGROUND

Many different structures exist for storing data in memory cells. Some dynamic memory cells include a capacitor used to store charge for a brief period of time. Such memory cells may be configured in one of two or more states. In one state, the memory cell stores charge using the capacitor and in the other state the memory cell does not store charge. Since charge stored by such capacitors eventually dissipates, such dynamic memory cells need to be periodically refreshed.

Other memory cells may be configured in one of two or more resistive states used to represent data. In one state, such memory cells have a relatively high resistance and in another state such memory cells have a relatively low resistance. Such memory cells may be arranged in a cross-point structure in which resistive memory cells are located between a word line and a bit line.

DETAILED DESCRIPTION OF EXAMPLE EMBODIMENTS

Figure 1:
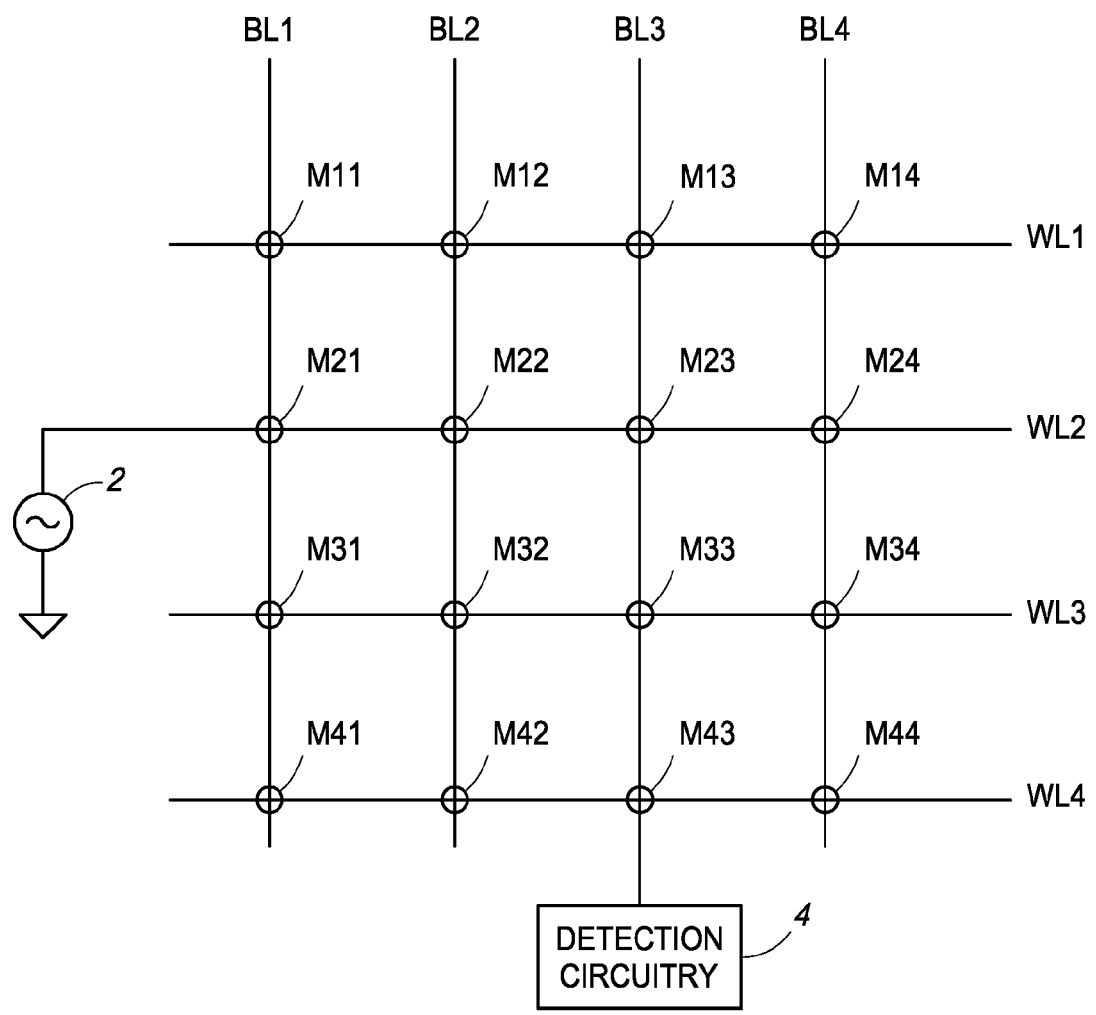
FIG. 1 is a diagrammatic schematic view of a non-volatile memory array in accordance with an embodiment of the invention.

Referring to FIG. 1, a portion of a non-volatile memory array in accordance with an embodiment of the invention is illustrated. The array includes a plurality of word lines WL1-WL4 and a plurality of bit lines BL1-BL4 crossing the plurality of word lines. The array further includes a plurality of memory cells M11-M44 represented symbolically by circles. The memory cells individually correspond to a different one of the crossings of the plurality of word lines and the plurality of bit lines relative to one another. For example, memory cell M12 corresponds to the crossing of WL1 and BL2 and memory cell M34 corresponds to the crossing of WL3 and BL4. The portion illustrated in FIG. 1 may be a very small portion of the non-volatile memory array. In addition to the word lines, bit lines, and memory cells illustrated in FIG. 1, the non-volatile memory array may include many more word lines, bit lines, and memory cells.

Although the word lines and bit lines of FIG. 1 are shown as being straight lines which orthogonally cross relative one another, other shapes and angles of intersection, whether existing or yet-to-be developed, may be used. The bit lines and word lines of FIG. 1 are diagrammatically and schematically shown in FIG. 1 as touching one another where such intersect, although such would not be ohmically connected relative to the depicted intersections.

Individual of the memory cells include a capacitor capable of being repeatedly programmed to at least two different capacitance states. The capacitor statically remains in a programmed capacitance state until programmed to a different capacitance state. The different capacitance states are characterized by having different capacitance values. In one capacitance state, the capacitor may have a first capacitance value and in another capacitance state, the capacitor may have different second capacitance value that may be significantly different than the first capacitance value. For example, in some embodiments, the second capacitance value may be a factor from two to ten times higher or lower than the first capacitance value.

The different capacitance states may be used to represent one or more bits of data. For example, a memory cell may represent a "1" when its capacitor is in a first capacitance state and the memory cell may represent a "0" when its capacitor is in a second capacitance state. In some embodiments, a memory cell may represent data using three or more different capacitance states.

The capacitor may remain in a capacitance state for months, years, or longer even if power is not provided to the capacitor. Accordingly, the capacitance state may be described as being non-volatile and static. Furthermore, the capacitance state of the memory cell may be repeatedly altered without damaging the memory cell.

In one embodiment, a method of writing to a memory cell (e.g., one of memory cells M11-M44) may include applying a write voltage between a pair of opposing conductive electrodes of the capacitor of the memory cell. The applying of the write voltage alters the capacitance state of the capacitor from one capacitance state to another capacitance state. Writing to a memory cell may also be referred to as programming a memory cell. A memory cell may store one or more bits of data by programming. For example, to program memory cell M24, a suitable write voltage may be applied across word line WL2 and bit line BL4 so that a voltage is applied across the capacitor of memory cell M24, thereby changing the capacitance state of the capacitor. During the programming of memory cell M24, word lines WL1, WL3, and WL4 and bit lines BL1, BL2, and BL3 may be held at appropriate voltages so that a write voltage sufficient to program a memory cell is not applied across the memory cells of the array other than memory cell M24. For example, in one embodiment, word lines WL1, WL3, and WL4 and bit lines BL1, BL2, and BL3 may be held at the same potential during programming of memory cell M24.

The method may also include reading data from the memory cell. Reading may include applying an AC voltage (e.g., using an AC voltage source 2) between a word line and bit line, and therefore between a pair of electrodes of the capacitor, and sensing current resulting from the applying of the AC voltage. Detection circuitry 4 may be provided to sense the current and may, based on the current, determine which capacitance state the capacitor is in and therefore the value of the data stored by the memory cell. For example, in one embodiment, voltage source 2 may be connected to word line WL2 and detection circuitry 4 may be connected to bit line BL3 to determine the value of data stored by memory cell M23 by determining the capacitance state of memory cell M23.

Figure 2:
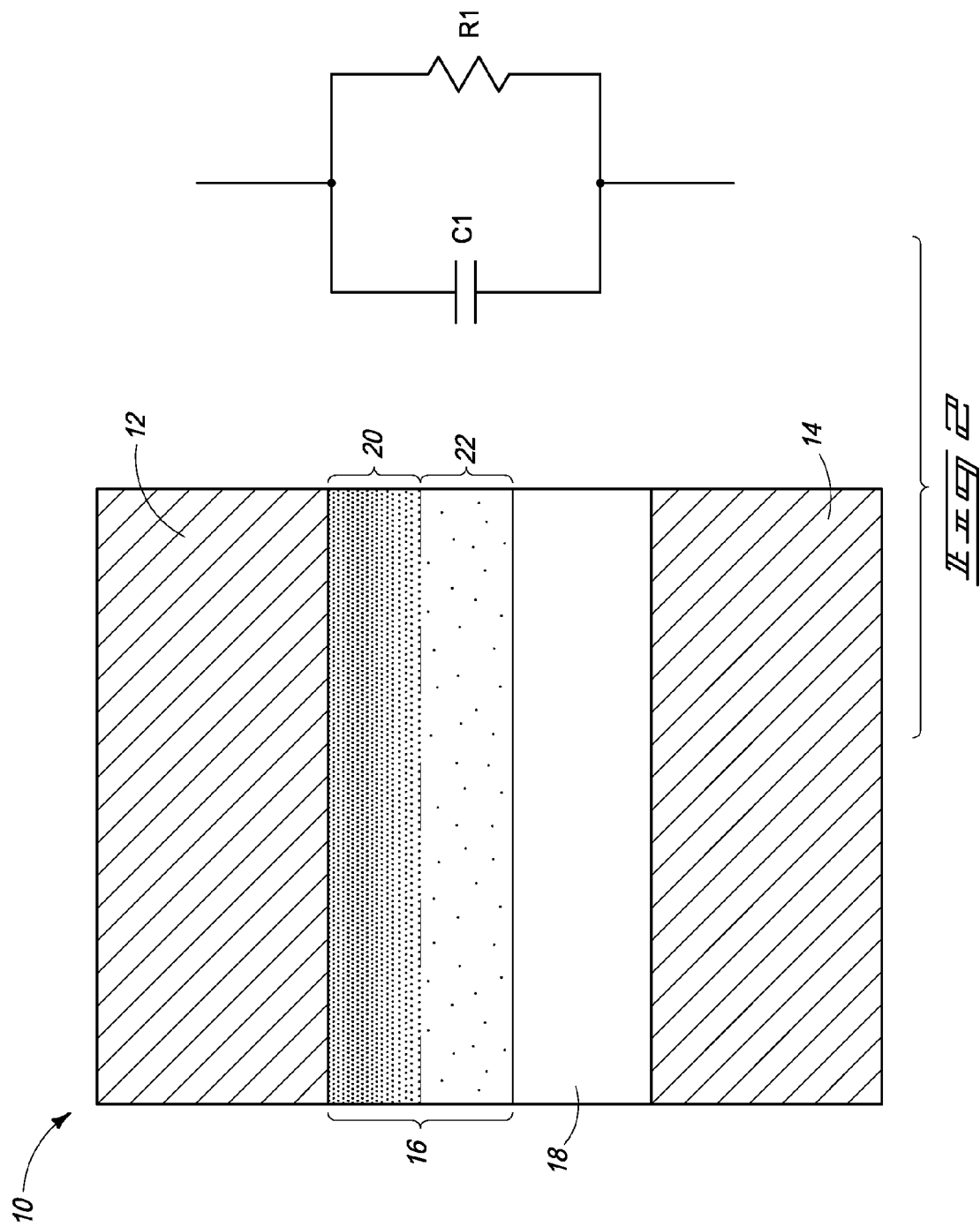
FIG. 2 is a diagrammatic sectional view of a memcapacitor device in one programmed state, and in accordance with an embodiment of the invention.
Figure 3:
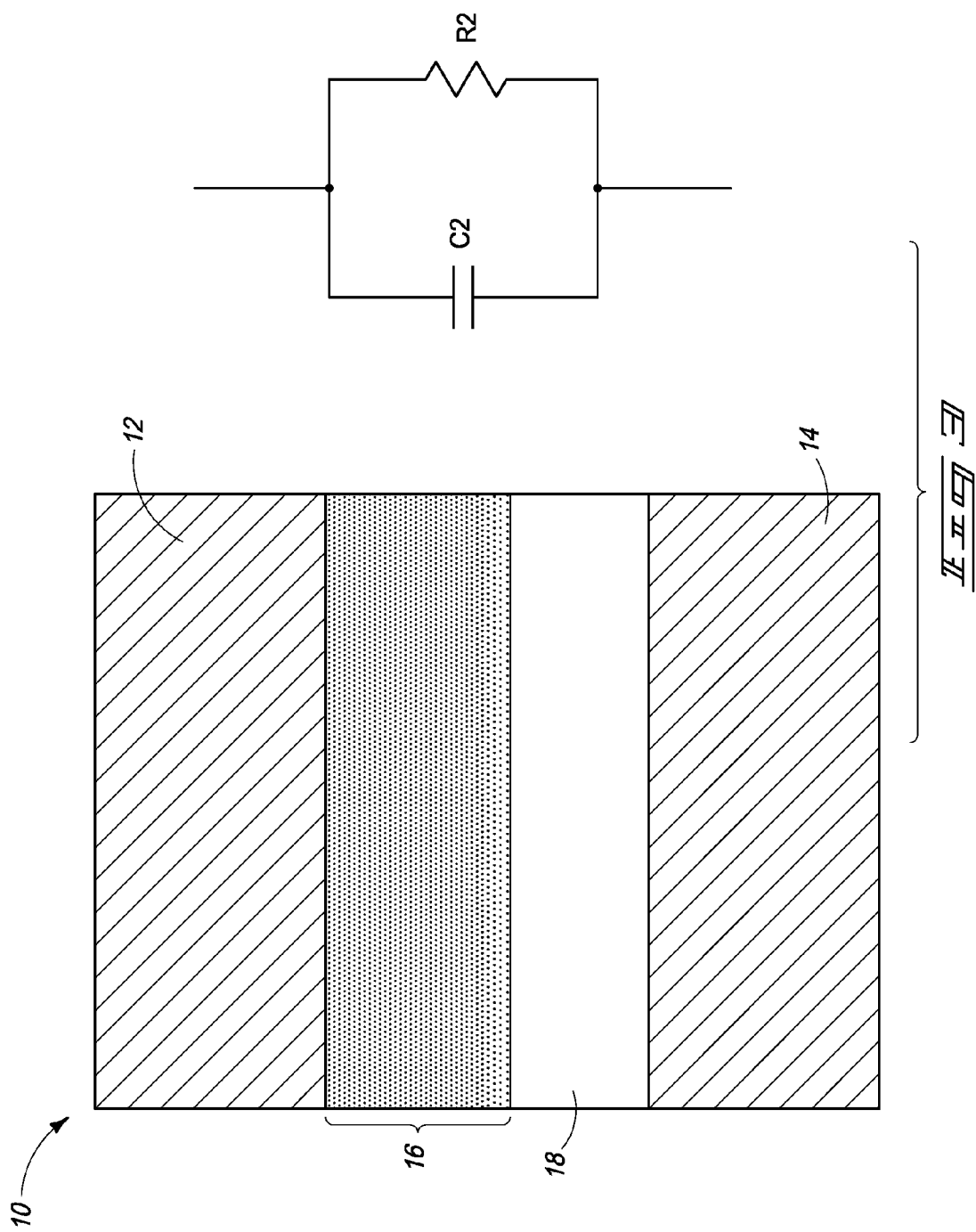
FIG. 3 is a view of the FIG. 2 memcapacitor device in another programmed state in accordance with an embodiment of the invention.

The methods described herein may be used with memory cells comprising capacitors capable of being repeatedly programmed to at least two different capacitance states. Individual of such capacitors may be embodied in many different forms. One embodiment of a such a capacitor is a memcapacitor device, for example a memcapacitor device 10 as shown in FIGS. 2 and 3. Such show memcapacitor device 10 in two different programmed states. Alternate and/or additional programmed states may be used.

Referring to FIG. 2, memcapacitor device 10 comprises a pair of opposing conductive electrodes 12 and 14. Such may be comprised of any suitable conductive material, for example elemental metals, alloys of elemental metals, conductive metal compounds, and/or conductively doped semiconductive materials. Electrodes 12 and 14 may be of the same or different thicknesses. An example thickness range is from 3 nanometers to 100 nanometers. Further, conductive electrodes 12 and 14 may be of the same or different composition relative to one another, and regardless may or may not be homogenous. In one example, such may consist essentially of elemental platinum. One of electrodes 12 and 14 may comprise one of a word line or a bit line where such cross. Further, the other of electrodes 12 and 14 may comprise the other of the word line or bit line where such cross.

At least two materials 16 and 18 are received between opposing conductive electrodes 12 and 14. Material 16 is a statically programmable semiconductive material which comprises mobile dopants that are received within a dielectric. It is statically programmable between at least two different states that are characterized by different capacitance values. At least one of the states includes localization or gathering of the mobile dopants such that a dielectric region is formed within material 16. More than two programmable states may be used.

In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. Mobile dopants of material 16 are depicted diagrammatically by dots/stippling in the drawings. Density of the dots/stippling in a given area/volume in the drawings indicates degree of mobile dopant density, with more dots/stippling indicating higher mobile dopant density and less dots/stippling indicating lower mobile dopant density. More than one type of mobile dopant may be used as part of material 16.

For material 16, example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$.

In one embodiment, material 16 that comprises oxygen vacancies as mobile dopants may comprise a combination of $TiO_2$ and $TiO_{2-x}$ in at least one programmed state depending on location of the oxygen vacancies and the quantity of the oxygen vacancies in the locations where such are received. In one embodiment, material 16 that comprises nitrogen vacancies as mobile dopants may comprise a combination of AlN and $AlN_{1-x}$ in at least one programmed state depending on location of the nitrogen vacancies and the quantity of the nitrogen vacancies in the locations where such are received. In one embodiment, material 16 that comprises fluorine vacancies as mobile dopants may comprise a combination of $MgF_2$ and $MgF_{2-x}$ in at least one programmed state depending on location of the fluorine vacancies and the quantity of the fluorine vacancies in the locations where such are received. In one embodiment, the mobile dopants comprise aluminum atom interstitials in a nitrogen-containing material.

Material 16 may be of any suitable thickness that may be dependent upon the composition of the dielectric, upon the composition of the mobile dopants, and/or upon the quantity of the mobile dopants in material 16. Example thicknesses include from 4 nanometers to 5 nanometers, and in one embodiment a thickness no greater than 120 nanometers.

Material 18 is a mobile dopant barrier dielectric material. Such may be homogenous or non-homogenous. Mobile dopant barrier dielectric material 18 is characterized or distinguished from the dielectric within material 16 by both being impervious to movement of mobile dopants to within material 18 and being impervious to location-changing-movement of any dopants inherently therein. Material 16 and barrier dielectric material 18 may be of different composition relative one another which is at least characterized by at least one different atomic element. In one embodiment, mobile dopant barrier dielectric material 18 comprises a metal oxide and the dielectric within which the mobile dopants are received in material 16 comprises another metal oxide, wherein a metal element of material 18 is different from a metal element of the dielectric of material 16. Regardless, example mobile dopant barrier dielectric materials include at least one of $ZrO_2$, $SiO_2$, $Si_3N_4$, GeN, and $SrTiO_3$. In one embodiment, the barrier dielectric material consists essentially of stoichiometric metal oxide, for example, either or a combination of $ZrO_2$ and $SrTiO_3$.

Material 16 and mobile dopant barrier dielectric material 18 may be of the same or different thicknesses relative one another. In one embodiment, mobile dopant barrier dielectric material 18 is no thicker than material 16, and in one embodiment as shown is thinner than material 16. In one embodiment, mobile dopant barrier dielectric material 18 has an equivalent oxide thickness from 1 nanometer to 7 nanometers, and in one embodiment has an equivalent oxide thickness no greater than 10 nanometers. In the context of this document, "equivalent oxide thickness" is a linear dimension of how thick undoped silicon dioxide would need to be to produce the same dielectric effect as the mobile dopant barrier dielectric material being used. Where the mobile dopant barrier dielectric material being used is undoped silicon dioxide or a material of equal permittivity to that of undoped silicon dioxide, the "equivalent oxide thickness" and the thickness of the mobile dopant barrier dielectric material being used would be the same.

One of semiconductive material 16 and barrier dielectric material 18 is closer to one of pair of electrodes 12, 14 than is the other of semiconductive material 16 and barrier dielectric material 18. Correspondingly, the other of the semiconductive material 16 and the barrier dielectric material 18 is closer to the other of pair of electrodes 12, 14. In the depicted embodiment, material 16 and mobile dopant barrier dielectric material 18 are in physical touching contact with one another. Further in the depicted embodiment, no other material is received between the pair of opposing conductive electrodes 12, 14 but for material 16 and mobile dopant barrier dielectric material 18.

As illustrated in FIG. 2, memcapacitor device 10 may be schematically modeled as a capacitor C1 and resistor R1 connected in parallel. Although barrier dielectric material 18 effectively prevents DC current from flowing between electrodes 12 and 14, memcapacitor device 10 may conduct a very small and insignificant amount of leakage current. Resistor R1 represents this leakage current. Capacitor C1 represents the capacitance of memcapacitor device 10 in the FIG. 2 programmed state and represents the combined capacitance of semiconductive material 16 and barrier dielectric material 18.

FIGS. 2 and 3 depict memcapacitor device 10 in two different static programmed states. FIG. 3 diagrammatically depicts an example highest capacitance state and FIG. 2 depicts an example lowest capacitance state. For example and by way of example only, FIG. 2 depicts material 16 as comprising regions 20 and 22 which are characterized by respective different average concentration of mobile dopants. Region 22 diagrammatically shows a significantly lower quantity of mobile dopants therein such that region 22 is effectively a dielectric. Some quantity of mobile dopants greater than zero may be within region 22 as long as region 22 may function in a dielectric capacity. Regardless, region 20 has a suitable higher average concentration of mobile dopants than any concentration of such within region 22. Any mobile dopants received within either of region 20 or region 22 may or may not be homogenously distributed within the respective region 20 or 22. Regardless, region 20 is electrically conductive, thereby effectively providing a thicker conductive capacitor electrode by a combination of material 12 and region 20. On the other hand, region 22 is dielectric thereby adding to the effective dielectric thickness of mobile dopant barrier dielectric material 18.

Referring to FIG. 3, the mobile dopants are shown to be sufficiently received throughout all of material 16 such that the entire thickness thereof is essentially electrically conductive. Accordingly, one of the conductive capacitor electrodes effectively constitutes the combination of materials 12 and 16. Further, in such state, only mobile dopant barrier dielectric material 18 constitutes all of the dielectric thickness between conductive capacitor electrodes 12 and 14. Thereby, the programmed state of FIG. 3 has higher capacitance than that depicted in FIG. 2. The mobile dopants may or may not be homogenously distributed throughout material 16 in the FIG. 3 high capacitance state. Further and regardless, different selectable programmed capacitance states beyond or in addition to a highest and lowest capacitance states may be achieved. Regardless, memcapacitor device 10 is characterized at least in part by retaining its programmed capacitance state after the act which provided the programmed state is removed.

In the FIG. 2 programmed state, memcapacitor 10 has a lower capacitance than when in the FIG. 3 programmed state. In other words, the capacitance of memcapacitor 10 in the FIG. 2 programmed state is lower than the capacitance of memcapacitor 10 in the FIG. 3 programmed state regardless of an amount of charge actually held by memcapacitor 10 at any given moment in time. Whether memcapacitor 10 is not charged, partially charged, or fully charged determines the charge state of memcapacitor 10, but does not affect the capacitance of memcapacitor 10. Thus, charge state, as used herein, refers to the amount of charge actually held by a capacitor at a given moment in time. Capacitance, as used herein, refers to a number of coulombs per volt that a capacitor is capable of holding regardless of the charge state of the capacitor.

As illustrated in FIG. 3, memcapacitor device 10 of FIG. 3 may be schematically modeled as a capacitor C2 and resistor R2 connected in parallel. Resistor R2 represents the insignificant leakage current of memcapacitor device 10 in the FIG. 3 programmed state and may be the same, lower or higher than R1 of FIG. 2. Capacitor C2 represents the capacitance of memcapacitor device 10 in the FIG. 3 programmed state, which is larger than C1 of FIG. 2 and represents the combined capacitance of semiconductive material 16 and barrier dielectric material 18.

As a specific example capacitor device 10, conductive capacitor electrodes 12 and 14 each consist essentially of elemental platinum having a thickness of 5 nanometers. Mobile dopant barrier dielectic material 18 is $ZrO_2$ having a thickness of 3 nanometers. Semiconductive material 16 is a combination of $TiO_2$ and $TiO_{2-x}$, and has an overall thickness of 4 nanometers. In FIG. 2, region 22 has a thickness of 2 nanometers and is $TiO_2$ that has sufficiently less than $5 \times 10^{18}$ oxygen vacancies/cm³ which renders region 22 non-conductive. Region 20 has a thickness of 2 nanometers and an overall average oxygen vacancy density sufficiently greater than 5×10¹⁸ vacancies/cm³ which renders region 20 conductive. In FIG. 3, material 16 may be considered as $TiO_{2-x}$ having an overall average oxygen vacancy density sufficiently greater than 5×10¹⁸ vacancies/cm³ which is sufficient to render all of region 16 to be conductive. Overall average oxygen vacancy density in region 20 in FIG. 2 is greater than that in region 16 in FIG. 3.

The respective capacitances in connection with the FIGS. 2 and 3 model may be characterized as:

$$C = A \frac{\varepsilon_1 \varepsilon_2}{\varepsilon_1 t_2 + \varepsilon_2 t_1}$$

where:
C is the device capacitance
A is the area of electrode 14 exposed to material 18.
$\varepsilon_1$ is the permittivity of material 16 characterized by region 22.
$\varepsilon_2$ is the permittivity of material 18.
$t_1$ is the thickness of region 22.
$t_2$ is the thickness of material 18.

The different programmed states may be attained by application of respective suitable differential voltages relative to conductive capacitor electrodes 12 and 14, such as described in Strukov et al. "*The missing memristor found*", Nature Publishing Group, 1 May 2008, Vol. 453, pp. 80-83. For example, depending upon charge of the mobile dopants, suitable positive and/or negative voltages could be applied to conductive electrodes 12 and 14 to cause the mobile dopants to be attracted to or repelled from one of conductive electrodes 12 and 14, with the depicted example programming states of FIGS. 2 and 3 being retained after the programming voltage differential is removed.

Regardless, in one embodiment a memcapacitor device comprises a pair of opposing conductive electrodes, for example conductive electrodes 12 and 14. At least two materials are received between the opposing conductive electrodes. One of the materials comprises a crystalline semiconductive metal-containing mass that is overall stoichiometrically cation deficient to form mobile cation vacancies in a space lattice. In one embodiment, the crystalline semiconductive metal-containing mass is a crystalline semiconductive metal oxide mass. The other material is a barrier dielectric material that is in physical touching contact with the crystalline semiconductive metal-containing mass and that is impervious to movement of mobile cation vacancies from said mass into the barrier dielectric material. The semiconductive mass and the barrier dielectric material are of different composition relative one another which is at least characterized by at least one different atomic element. One of the semiconductive mass and the barrier dielectric material is closer to one of the pair of electrodes than is the other of the semiconductive mass and the barrier dielectric material. The other of the semiconductive mass and the barrier dielectric material is closer to the other of the pair of electrodes than is the one of the semiconductive mass and the barrier dielectric material. Example materials for the crystalline semiconductive metal-containing mass in this embodiment include those described above for material 16. Example materials for a barrier dielectric material in this embodiment include those described above for barrier dielectric material 18. Other attributes in this embodiment may include any one or combination of those described above with respect to the example embodiments described with reference to FIGS. 2 and 3.

Figure 4:
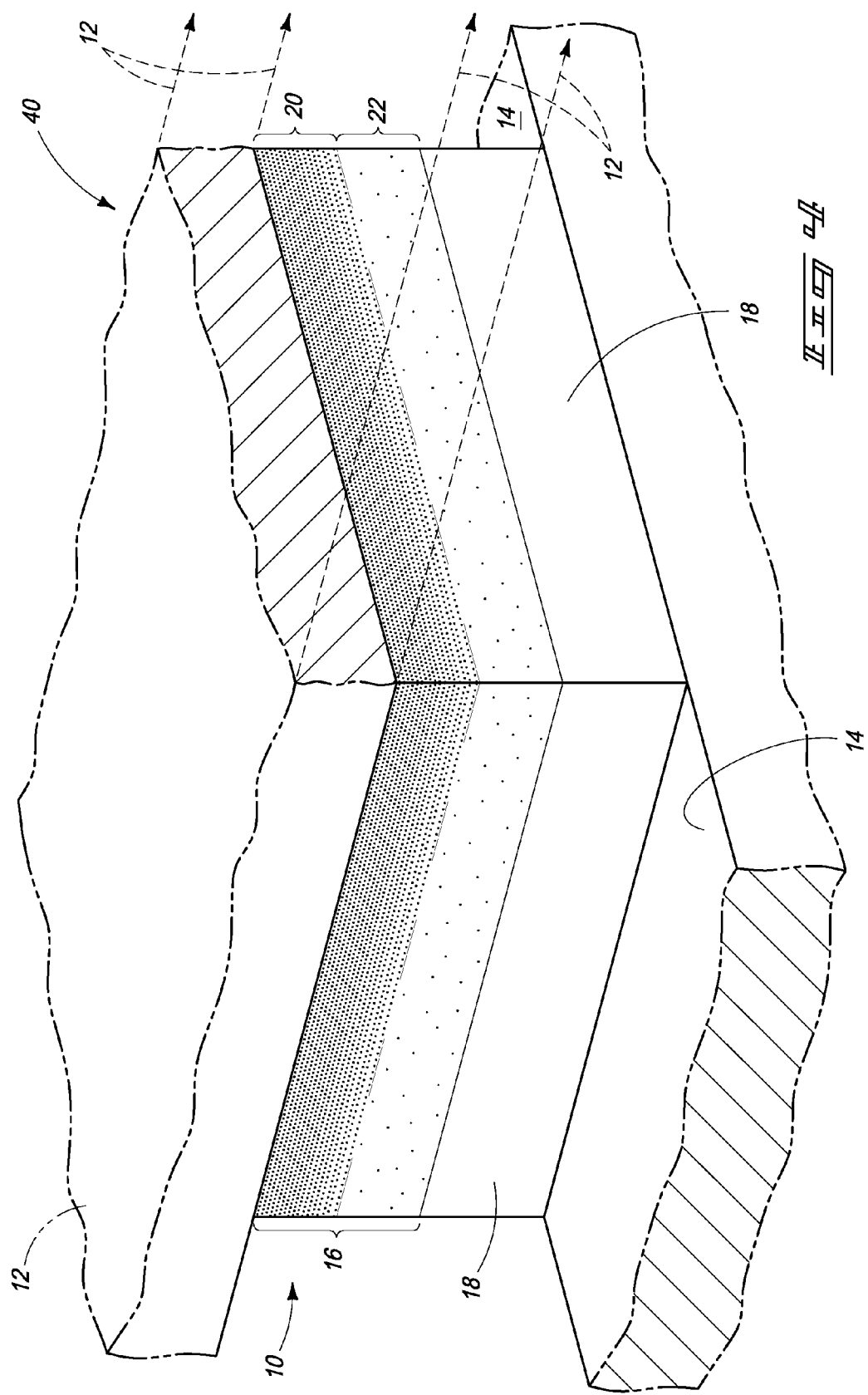
FIG. 4 is a diagrammatic isometric view of a memory cell in one programmed state, and in accordance with an embodiment of the invention.

Referring to FIG. 4, a single cross-point memory cell 40 that includes memcapacitor 10 in the FIG. 2 programmed state is illustrated. In this embodiment, electrode 12 may be a word line (e.g., one of word lines W1-W4 of FIG. 1) and electrode 14 may be a bit line (e.g., one of bit lines B1-B4 of FIG. 1), with memory cell 40 being one of M11-M44. Alternately, electrode 12 may be a bit line (e.g., one of bit lines B1-B4 of FIG. 1) and electrode 14 may be a word line (e.g., one of word lines W1-W4 of FIG. 1).

Accordingly, in one embodiment, FIG. 4 illustrates a cross-point memory cell comprising a word line 12 extending in a first direction and a bit line 14 extending in a second direction different from the first direction. Bit line 14 and word line 12 cross without physically contacting each other. Memcapacitor 10 is formed between word line 12 and bit line 14 where such cross. As was discussed above, memcapacitor 10 is capable of being repeatedly programmed to at least two different capacitance states. The capacitor includes capacitor dielectric material 18 configured to prevent DC current from flowing between word line 12 and bit line 14. The capacitor further includes semiconductive material 16.

In one embodiment, word line 12 or 14 may comprise, consist essentially of, or consist of platinum. Semiconductive material 18 may comprise, consist essentially of, or consist of $TiO_2$ and $TiO_{2-x}$ and may be about 50 nm thick. Capacitor dielectric material 18 may comprise, consist essentially of, or consist of $ZrO_2$ and may be about 3 nm thick. Bit line 12 or 14 may comprise, consist essentially of, or consist of platinum.

Figure 5:
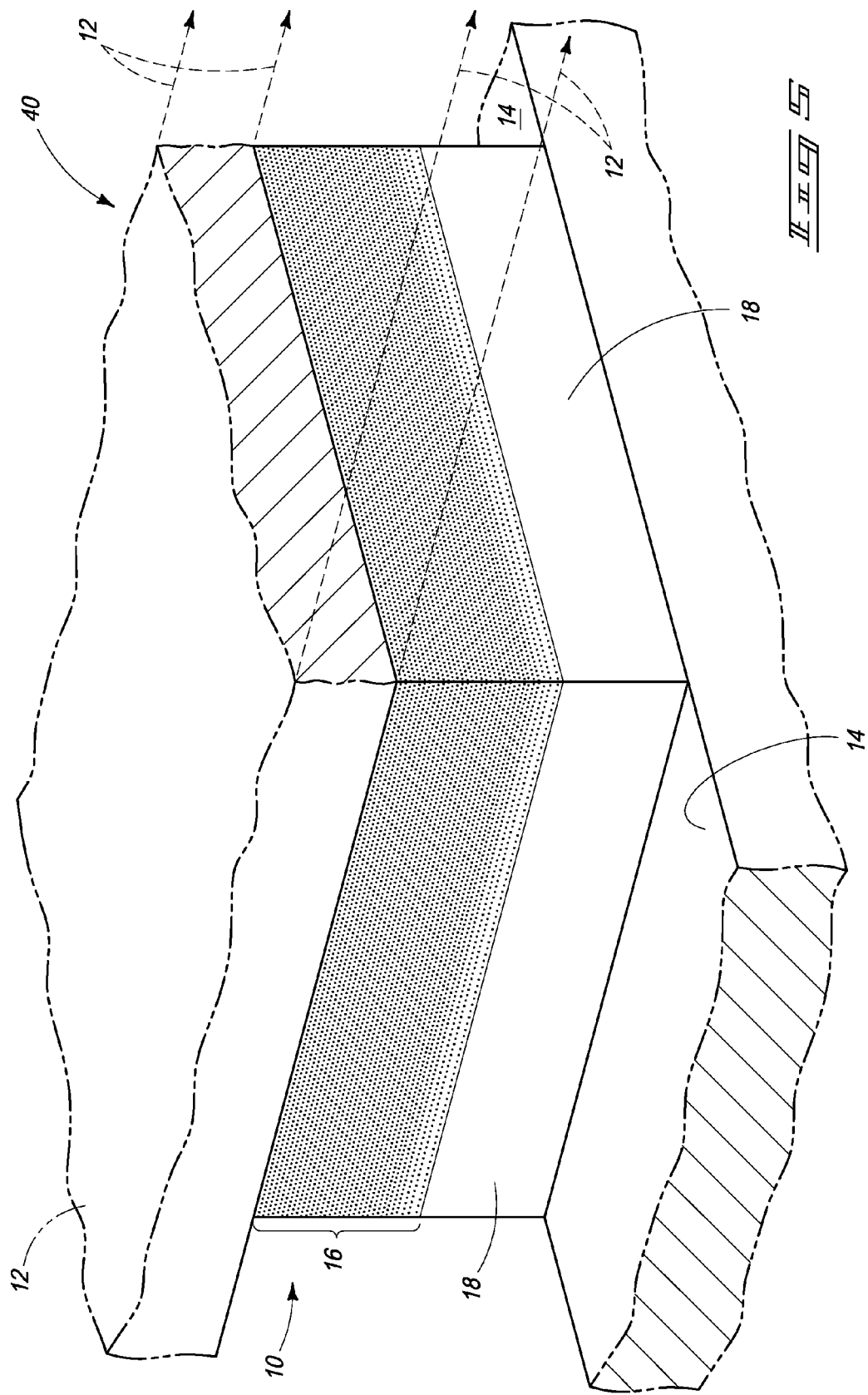
FIG. 5 is a diagrammatic isometric view of the FIG. 4 memory cell in another programmed state, and in accordance with an embodiment of the invention.

Referring to FIG. 5, memcapacitor 10 of cross-point memory cell 40 is depicted in the FIG. 3 programmed state.

Figure 6:
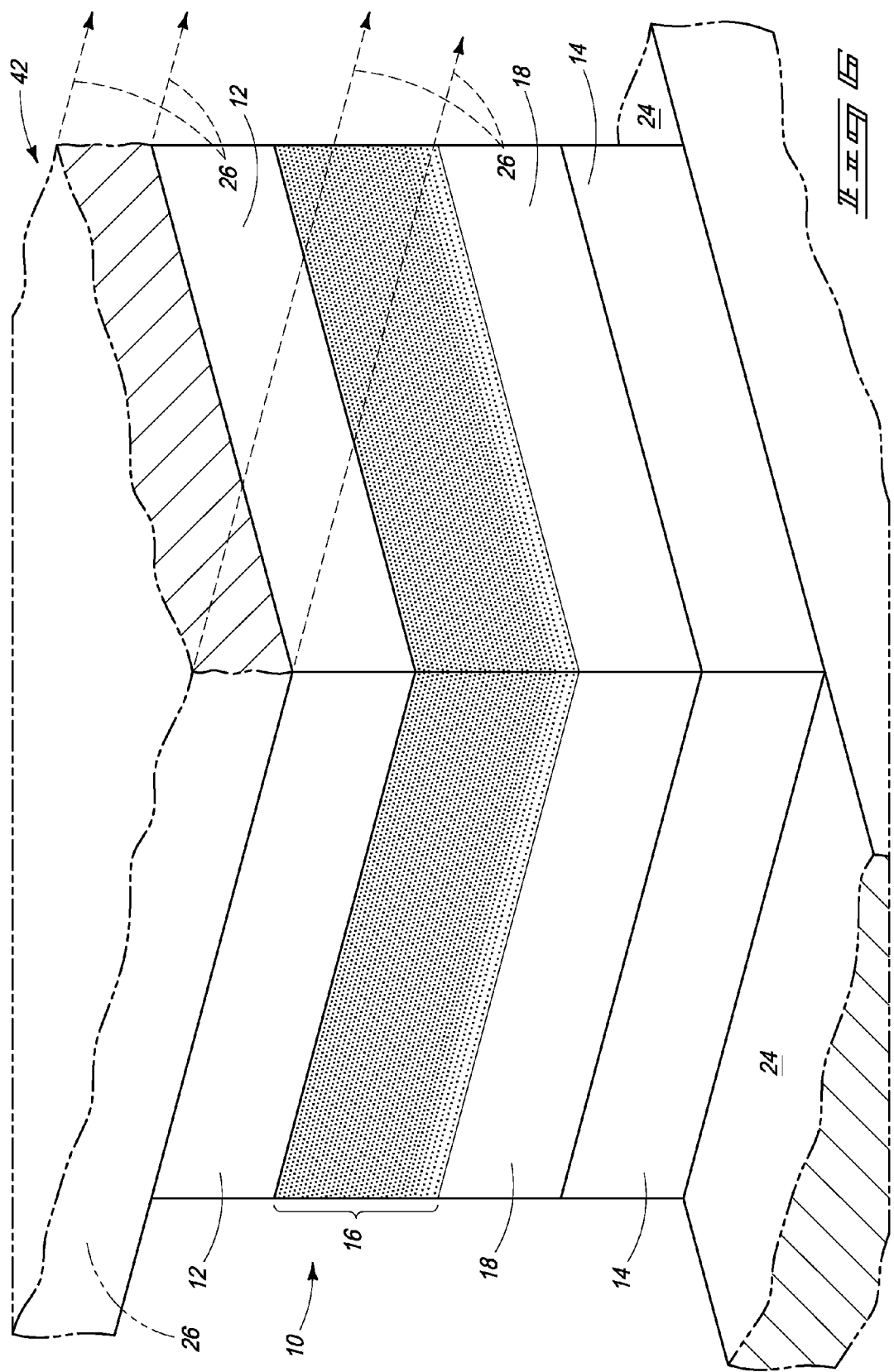
FIG. 6 is a diagrammatic isometric view of a memory cell in one programmed state, and in accordance with an embodiment of the invention.

Referring to FIG. 6, another embodiment of a cross-point memory cell 42 is illustrated. Such comprises capacitor 10 positioned between conductive lines 24 and 26. Line 24 would be a bit line or word line of the FIG. 1 array and line 26 would be the other of the bit line or word line of the FIG. 1 array where respective pairs of such bit lines and word lines cross. In this embodiment, the capacitor comprises a first electrode 12 electrically connected to conductive line 26 corresponding to the individual memory cell and a second electrode 14 electrically connected to conductive line 24 corresponding to the individual memory cell. First electrode 12 may have one or both of different composition and different thickness than conductive line 26. Second electrode 14 may have one or both of different composition and different thickness than conductive line 24. First electrode 12 may be of the same composition as conductive line 26. Second electrode 14 may be of the same composition as conductive line 24. Regardless, example respective thicknesses for electrodes 12 and 14 in FIG. 6 are 5 nanometers and 5 nanometers.

In one embodiment, a method of programming a memory cell may include applying a write voltage across a word line of a memory cell 40/42 and a bit line of memory cell 40/42. Memory cell 40/42 may include a capacitor, for example capacitor 10 described above. As a result of the applying of the write voltage, the capacitance of the capacitor is changed from a first value to a second value. The second value may be at least twice the first value. Such a method further includes removing the write voltage from between the word line and the bit line. The capacitance statically remains at the second value after the removing of the write voltage.

Applying the write voltage may cause mobile dopants to move within semiconductive mass 16 received between the word line and the bit line toward mobile dopant barrier dielectric material 18 received between the word line and the bit line to increase the capacitance of the capacitor from a lower capacitance state to a higher capacitance state. Semiconductive mass 16 and mobile dopant barrier dielectric material 18 are of different composition relative one another which is at least characterized by at least one different atomic element. Mobile dopant barrier dielectric material 18 inherently shields mobile dopants from moving into mobile dopant barrier dielectric material 18 by the applying of the voltage. In one embodiment, the applying of the write voltage comprises applying the write voltage for less than 100 microseconds.

In one embodiment, the write voltage may be a DC voltage. However, other suitable voltages that cause the mobile dopants to move within semiconductive mass 16 may be used including AC voltages having a frequency lower than 5 kHz.

The above write voltage may be referred to as a first write voltage and the method may also include applying a second write voltage different from the first write voltage between the word line and the bit line. The second write voltage may have a polarity opposite that of a polarity of the first write voltage. Regardless, as a result of the applying of the second write voltage, the capacitance of the capacitor is changed from the second value to a third value. Upon removing the second write voltage from between the word line and the bit line, the capacitance of capacitor 10 statically remains at the third value. The third value may be less than the second value and in some cases may be less than half of the second value. The second write voltage may cause the mobile dopants to move away from mobile dopant barrier dielectric material 18, thereby reducing the capacitance of capacitor 10.

In one embodiment, the third value may be substantially the same as the first value. In other words, after the applying of the second write voltage, the memory cell may have substantially the same capacitance as it did prior to the applying of the first write voltage. Alternatively, the capacitance of the memory cell after the applying of the second write voltage may be slightly different than the capacitance of the memory cell prior to the applying of the first write voltage since, in one embodiment, the mobile dopants might not return to precisely the same locations. However, the resulting capacitance may still be low enough that the memory cell may reliably represent the same data value as it did prior to the applying of the first write voltage.

In one embodiment, a magnitude of the first and second write voltages may be selected so that the memory cells are programmed within 10 nanoseconds to 100 microseconds. The selected magnitude may be sufficient to cause mobile dopants within semiconductive material 16 to move at a rate of $2 \times 10^8$ nanometers per second to $2 \times 10^4$ nanometer per second.

The programming method described above may be used for memory cells including a memcapacitor such as memcapacitor 10. Alternatively, the programming method may be used for memory cells comprising other capacitor embodiments in which the capacitor changes its capacitance as a result of a write voltage being applied across the capacitor.

An embodiment of the invention encompasses a method of programming a capacitor between different static programmable states characterized by different capacitance. Such may encompass using capacitors as described above, or using other capacitors. Regardless, an embodiment of such method comprises applying a voltage differential between two conductive capacitor electrodes to cause mobile dopants to move from a semiconductive mass received between the two conductive capacitor electrodes toward a mobile dopant barrier dielectric material received between the two conductive capacitor electrodes to increase capacitance of the capacitor from a lower capacitance state to a higher capacitance state. The semiconductive mass and the mobile dopant barrier dielectric material are of different composition relative one another which is at least characterized by at least one different atomic element. The mobile dopant barrier dielectric material inherently shields mobile dopants from moving into the mobile dopant barrier dielectric material by applying of the voltage. Example mobile dopants, semiconductive mass/material and mobile dopant dielectric materials may be as described above. FIGS. 2 and 3 and FIGS. 4 and 5 depict an example of such programming in going from the state of FIG. 2 to that of FIG. 3 and from the state of FIG. 4 to that of FIG. 5. Such may be accomplished by applying suitable positive and/or negative voltages to capacitor electrodes 12 and 14 which cause the mobile dopants to migrate toward electrode 14 or away from electrode 12 thereby transforming the programmed state.

In one embodiment, a different voltage differential is subsequently applied between the two conductive capacitor electrodes to cause the mobile dopants to move away from the mobile dopant barrier dielectric material to reduce capacitance of the capacitor and thereby program the capacitor to one of said different static programmable states. Such may, for example, occur by programming the FIG. 3 or FIG. 5 state back to the FIG. 2 or FIG. 4 state by polarity reversal or by application of some other suitable differential voltage to achieve the stated reduced capacitance effect. Further, such subsequently applied voltage differential may or may not program the capacitor back to the immediately preceding capacitance state. Accordingly, programming to more than two capacitance states may selectively occur.

According to one embodiment, a method of reading a memory cell includes applying an AC voltage signal (e.g., using source 2 of FIG. 1) across a word line and a bit line of the memory cell. In one embodiment, the AC voltage signal is a periodic, sinusoidal signal have a frequency of about 200 MHz and a peak-to-peak voltage of about 2V. The memory cell is configured to be selectively programmed in any one of at least two different static states, such as the states associated with FIGS. 4 and 5 above. The method further includes sensing a current on the bit line of the memory cell, the current resulting from the applying of the AC voltage signal, and based on the sensing, determining in which of the at least two different static states the memory cell is programmed. In one embodiment, detection circuitry 4 may perform the sensing and determining.

The method may further include removing the AC voltage signal from the memory cell. The capacitor may have substantially the same capacitance prior to the applying of the AC voltage signal as after the removing of the AC voltage signal. In one embodiment, the memory cell may include capacitor 10 described above. While the AC voltage signal is being applied across capacitor 10, some, none, or all of the mobile dopants of semiconductive material 16 may move due to the AC voltage. However, such movement may be a back and forth movement such that when the AC voltage is removed, the mobile dopants will be in or very near the locations that they were in prior to the applying of the AC voltage. Accordingly, the capacitance of the memory cell may be substantially the same after the applying of the AC voltage even though the mobile dopants may move during the applying of the AC voltage.

During the applying of the AC voltage signal, current flows from the bit line into the memory cell at a first moment in time and from the memory cell to the bit line at a second moment in time subsequent to the first moment in time.

In one embodiment, the AC voltage signal may be periodic and the sensing of the current may include sensing the current when the AC voltage signal is periodic. In one embodiment, the AC voltage signal may have a substantially constant frequency and the sensing of the current may include sensing the current when the AC voltage signal has a substantially constant frequency. In one embodiment, the AC voltage signal may be substantially sinusoidal and the sensing of the current may include sensing the current when the AC voltage signal is substantially sinusoidal. In one embodiment, the AC voltage signal, in steady state, has a dominant frequency component with a frequency greater than or equal to 100 MHz during at least some of the applying. In one embodiment, the sensing of the current includes sensing the current when the AC voltage signal is in a steady state. The AC voltage signal may have a peak-to-peak voltage of at least 1 volt during at least some of the applying.

The current may be referred to as a first current and the memory cell may be programmed in a first one of the at least two different static states. The method may further comprise, after the sensing of the first current, programming the memory cell in a second one of the at least two different static states, applying the AC voltage signal to the word line while the memory cell is programmed in the second one of the at least two different static states, and sensing a second current on the bit line. The second current results from the applying of the AC voltage signal while the memory cell is programmed in the second one of the at least two different static states and the second current may be at least twice as large as the first current. The method may also include, based on the sensing of the second current, determining that the memory cell is programmed in the second one of the at least two different static states. The second current may be at least five times as large as the first current.

An example of reading a memory cell will now be described. Referring to FIG. 1, memory cell M23 may be read by applying AC voltage source 2 to word line WL2 and connecting detection circuitry 4 to bit line BL3. An AC voltage signal generated by source 2 may be conducted by memory cell M23 to some degree based on the capacitance state of memory cell M23. Detection circuitry 4 may detect the conducted signal on bit line BL3 in the form of an AC current. Detection circuitry 4 may determine the capacitance state of memory cell M23 based on the magnitude of the AC current.

In one embodiment, detection circuitry 4 may be configured to convert a current signal into a voltage signal. For example, detection circuitry 4 may be a transimpedance amplifier. Alternatively, detection circuitry 4 may include a lock-in amplifier for detecting the current and determining the capacitance state of memory cell M23.

In one embodiment, the array of FIG. 1 may include one or more row drivers used to read the memory cells. Such row drivers may include voltage source 2. In some configurations, more than one-thousand memory cells of an array may be read simultaneously using one or more of the row drivers and detection circuitry 4 without taxing the row drivers because the total current supplied by source 2 in reading the memory cells is small relative to DC currents produced by conventional row drivers used to read memory cells of conventional memory arrays.

Bit line BL3 may be grounded while the AC voltage signal is applied to word line WL2. In one embodiment, bit line BL3 may be grounded by a virtual ground of detection circuitry 4, for example, a virtual ground of a transimpedance amplifier.

Although the methods of reading a memory cell using an AC voltage signal described herein may be used with a cross-point memory array, such methods may alternatively be used with other memory array structures. In fact, the methods may be used with memory array structures that use a memory element other than a capacitor to statically store data. For example, the memory element may include a memristor, phase change material, or other memory element in which the data value may be determined by passing an AC current through the memory element and sensing the resulting AC current to determine the state of the memory element.

Figure 7:
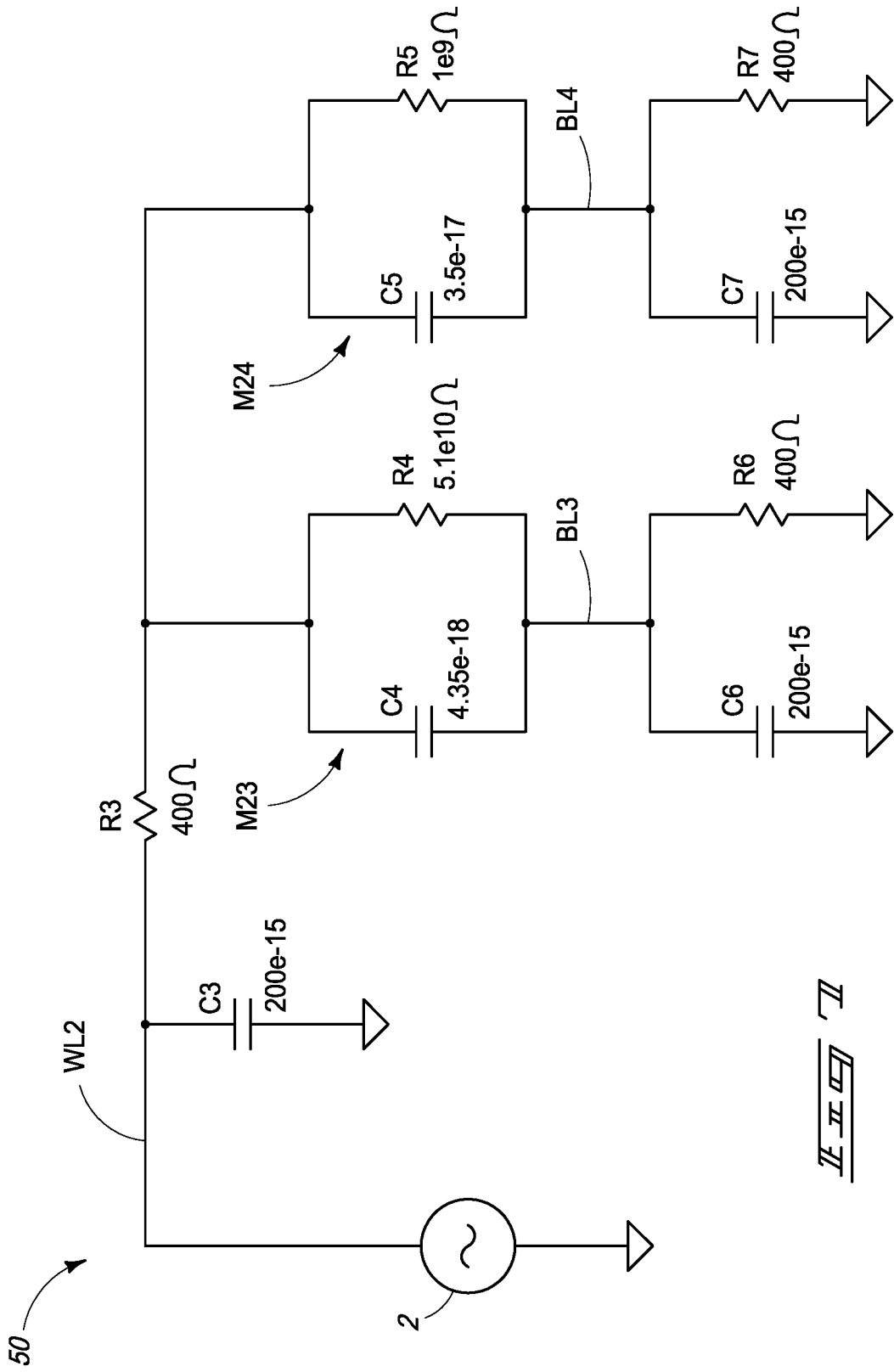
FIG. 7 is a schematic representation of a portion of a non-volatile memory array in one programmed state, and in accordance with an embodiment of the invention.

Referring to FIG. 7, a schematic diagram 50 of circuitry for reading two memory cells according to one embodiment is illustrated. Diagram 50 includes AC voltage source 2 connected to word line WL2. Capacitor C3 represents stray capacitance between word line WL2 and word lines adjacent to word line WL2 (not illustrated in FIG. 7). Resistor R3 represents the resistance of word line WL2.

Diagram 50 depicts memory cell M23 configured in a low or lowest capacitance state in which memory cell M23 may represent a "1" or a "0." Capacitor C4 represents the capacitance of memory cell M23 and resistor R4 represents leakage current through memory cell M23. Memory cell M24, on the other hand, is depicted as being configured in a high or highest capacitance state in which memory cell M24 may represent the opposite data value as memory cell M23, namely a "0" if memory cell M23 represents a "1" and a "1" if memory cell M23 represent a "0." Capacitor C5 represents the capacitance of memory cell M24 and resistor R5 represents leakage current through memory cell M24. Note that in this example, capacitance C5 is about eight times capacitance C4. This difference in capacitance can cause the magnitude of an AC current conducted by memory cell M24 to be significantly higher than the magnitude of an AC current conducted by memory cell M23, as is discussed further below in relation to FIG. 9.

Capacitor C6 represents stray capacitance between bit line BL3 and adjacent bit lines and resistor R6 represents the resistance of bit line BL3. Similarly, capacitor C7 represents stray capacitance between bit line BL4 and adjacent bit lines and resistor R7 represents the resistance of bit line BL4.

Detection circuitry may be connected to bitlines BL3 and BL4 to measure AC currents present on bit lines BL3 and BL4.

Figure 8:
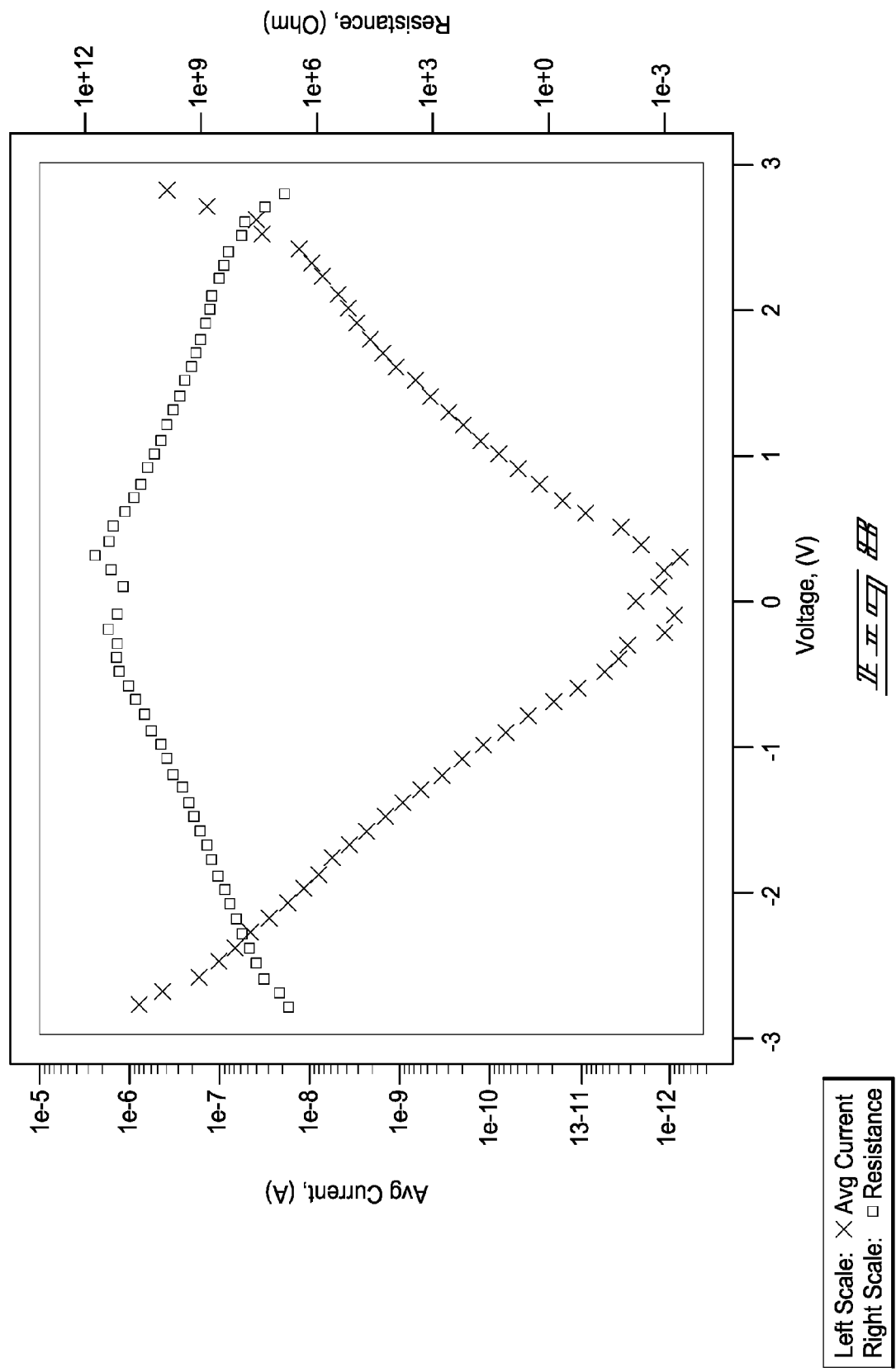
FIG. 8 is a plot illustrating characteristics of a memory cell in accordance with an embodiment of the invention.

Referring to FIG. 8, a plot is illustrated that depicts current flowing through capacitor dielectric material 18 as a function of voltage across capacitor dielectric material 18 and resistance of capacitor dielectric material 18 as a function of voltage across capacitor dielectric material 18. The values of current and resistance depicted in FIG. 8 are for an embodiment of the memory cell of FIGS. 4 and 5 in which word line 12 comprises platinum; semiconductive material 18 comprises $TiO_2$ and $TiO_{2-x}$ and is about 50 nm thick; capacitor dielectric material 18 comprises $ZrO_2$ and is about 3 nm thick; and bit line 14 comprises platinum. In this example, capacitor dielectric material 18 may have an effective permittivity of about 35. Note that the resistance and current vary with voltage, the current generally increasing and the resistance generally decreasing as the voltage increases.

Figure 9:
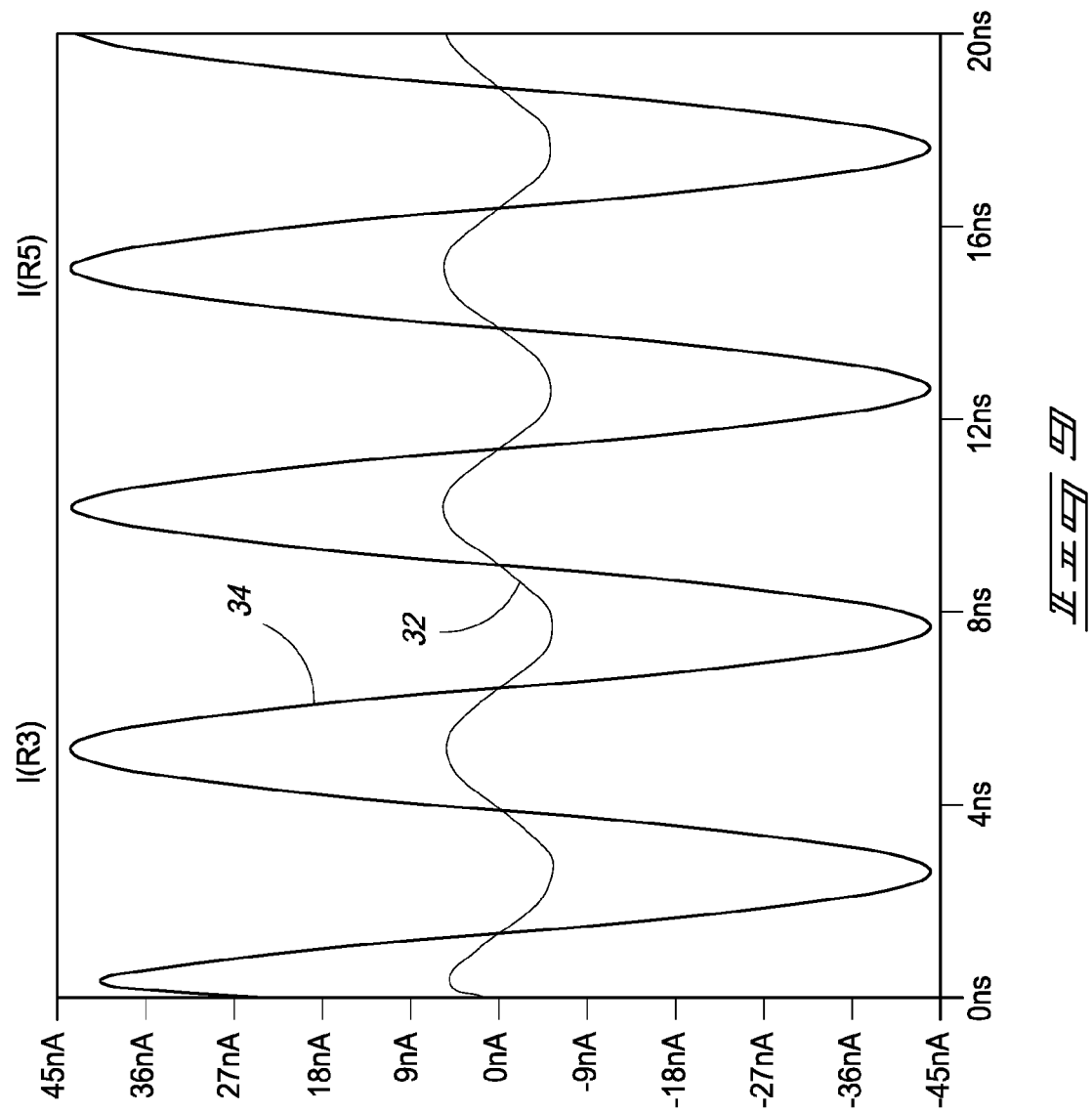
FIG. 9 is a plot illustrating currents in accordance with an embodiment of the invention.

Referring to FIG. 9, a plot of AC current conducted by memory cell 40 as measured on a bit line is illustrated. In one embodiment, the current may be measured, for example, by detection circuitry 4. Line 32 represents current measured on the bit line when capacitor 10 of memory cell 40 is in the FIG. 4 programmed state, when capacitor 10 is in a low capacitance state. Line 34 represents current measured on the bit line when capacitor 10 of memory cell 40 is in the FIG. 5 programmed state, when capacitor 10 is in a high capacitance state.

Note that in this example, the current represented by line 32 has a magnitude of about 5 nA and the current represented by line 34 has a magnitude of about 45 nA. Accordingly the current represented by line 34 is about 9 times the current of line 32. This difference in magnitude enables detection circuitry 4 to distinguish between a memory cell in a high capacitance state and a memory cell in a low capacitance state.

For example, line 32 may represent current on bit line BL3 conducted by memory cell M23 in the example described above in relation to FIG. 7. As was mentioned above, memory cell M23 may be in a low or lowest capacitance state, in one example. Line 34 may represent current on bit line BL4 conducted by memory cell M24 in the example described above in relation to FIG. 7. As was mentioned above, memory cell M24 may be in a high or highest capacitance state, in one example.

Detection circuitry 4 may determine that memory cell M23 is in the low or lowest capacitance state by comparing the current represented by line 32 to a first threshold, in one embodiment, and determining that the current is below the threshold. Furthermore, detection circuitry 4 may determine that memory cell M24 is in a high or highest capacitance state by comparing the current represented by line 34 to a second threshold, in one embodiment, and determining that the current is above the threshold. The first and second thresholds may be the same or different from one another. For example, the first threshold may be lower than the second threshold.

Figure 10:
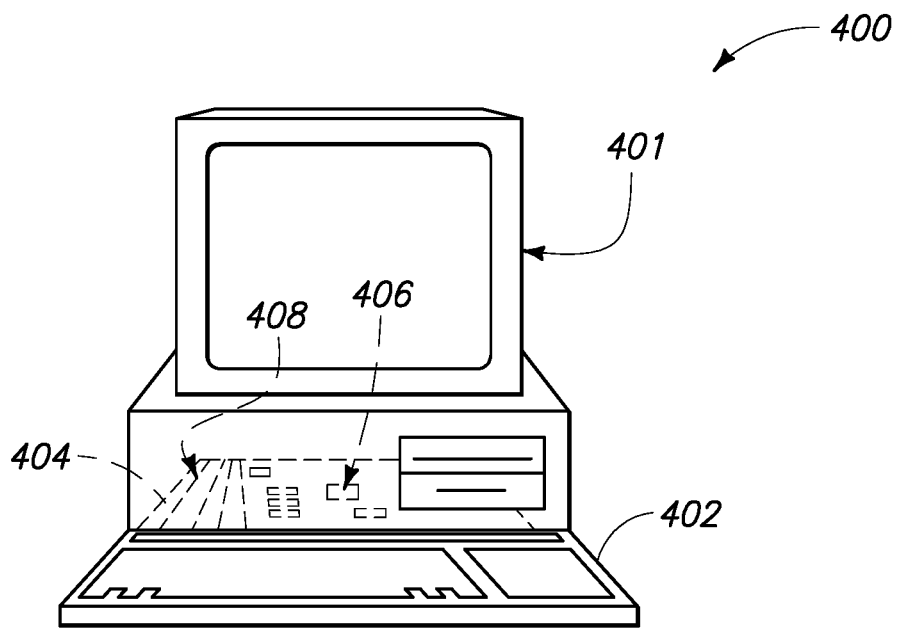
FIG. 10 is a diagrammatic view of a computer in accordance with an embodiment of the invention.
Figure 11:
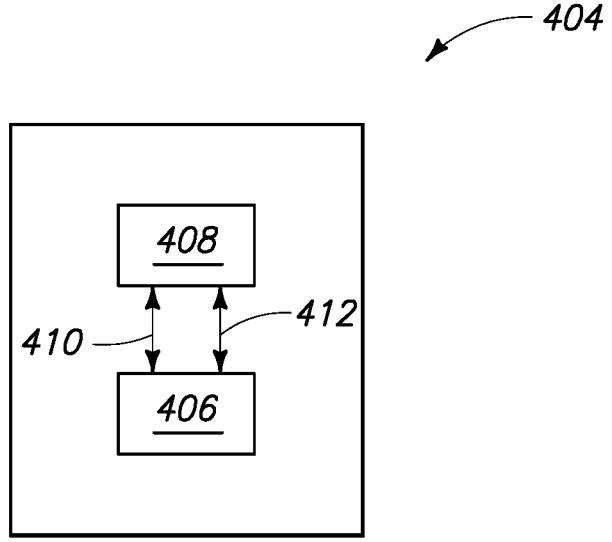
FIG. 11 is a block diagram of a computer motherboard in accordance with an embodiment of the invention.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 (processing circuitry) or other data processing unit, and at least one memory device 408 (memory circuitry). Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention. Processor device 406 may be configured to instruct memory device 408 to store data that processor device 406 provides to memory device 408 and may be configured to retrieve the data from memory device 408.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device.

Memory device 408 can comprise memory formed in accordance with one or more aspects of the present invention.

Figure 12:
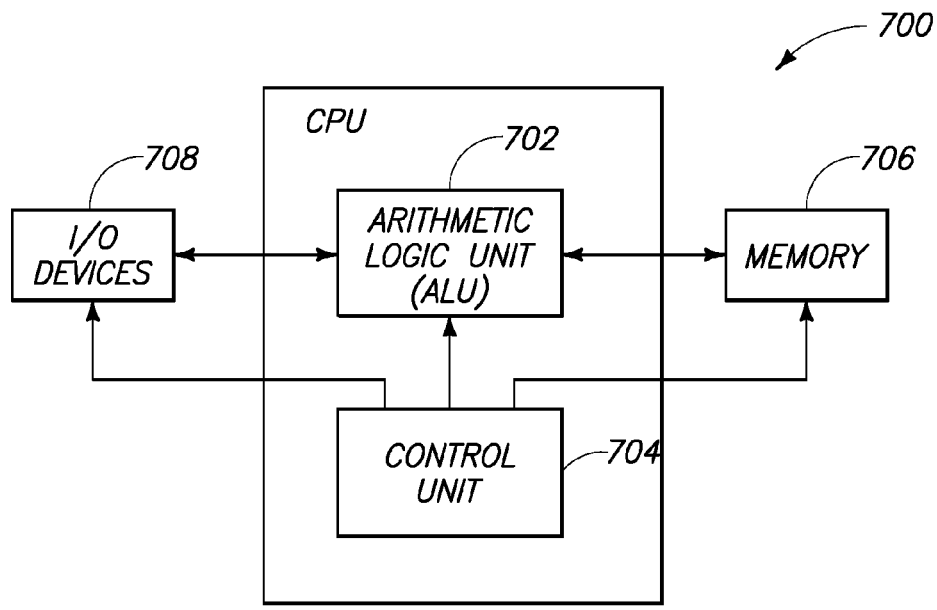
FIG. 12 is a high-level block diagram of an electronic system in accordance with an embodiment of the invention.

FIG. 12 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 13:
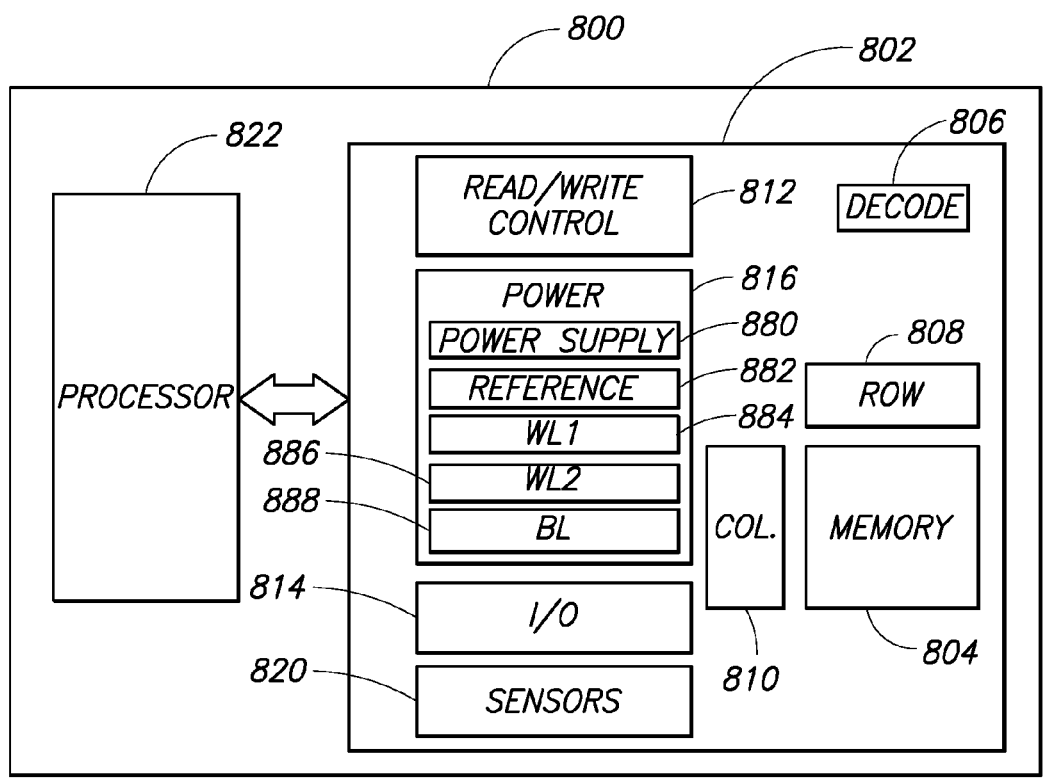
FIG. 13 is another high-level block diagram of an electronic system in accordance with an embodiment of the invention.

FIG. 13 is a simplified block diagram of a high-level organization of various embodiments of an exemplary electronic system 800. The system 800 includes a memory device 802 (memory circuitry) that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822 (processing circuitry), or memory controller for memory accessing. Processor 822 may be configured to instruct memory device 802 to store data provided by processor 822 and may be configured to retrieve the stored data from memory device 802.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
    a first electrode;
    a second electrode;
    semiconductive material intermediate the first and second electrodes, the semiconductive material comprising a plurality of mobile dopants which move from a first region of the semiconductive material to a second region of the semiconductive material as a result of an application of a voltage across the first and second electrodes;
    wherein a capacitance of the memory cell changes from a first capacitance corresponding to a first programmed state of the memory cell to a second capacitance corresponding to a second programmed state of the memory cell as a result of the movement of the mobile dopants; and
    wherein the semiconductive material has different dielectric thicknesses when the memory cell is in the first and second programmed states.

2. The memory cell of claim 1 wherein the second region of the semiconductive material is electrically insulative when the memory cell is in the first programmed state and electrically conductive when the memory cell is in the second programmed state.

3. The memory cell of claim 1 wherein a concentration of the mobile dopants in the second region is increased as a result of the application of the voltage across the first and second electrodes.

4. The memory cell of claim 1 wherein the memory cell is configured to retain the second capacitance after the application of the voltage has been ceased.

5. A memory cell comprising:
    a first electrode;
    a second electrode;
    semiconductive material intermediate the first and second electrodes, the semiconductive material comprising a plurality of mobile dopants which move from a first region of the semiconductive material to a second region of the semiconductive material as a result of an application of a voltage across the first and second electrodes;
    a barrier material intermediate the semiconductive material and one of the first and second electrodes, and wherein the barrier material is impervious to movement of the mobile dopants from the semiconductive material to the barrier material; and
    wherein a capacitance of the memory cell changes from a first capacitance corresponding to a first programmed state of the memory cell to a second capacitance corresponding to a second programmed state of the memory cell as a result of the movement of the mobile dopants.

6. The memory cell of claim 5 wherein the barrier material is adjacent to the second region of the semiconductive material.

7. The memory cell of claim 5 wherein the barrier material is electrically insulative.

8. The memory cell of claim 1 wherein the memory cell has an increased capacitance in the second programmed state compared with the first programmed state.

9. A memory cell comprising:
    a capacitor configured to have at least two different capacitive states corresponding to different programmed states of the memory cell, the capacitor comprising:
        a first electrode;
        a second electrode; and
        semiconductive material intermediate the first and second electrodes;
    wherein a region of the semiconductive material is electrically insulative when the memory cell is in a first of the programmed states and electrically conductive when the memory cell is in a second of the programmed states;
    wherein a plurality of mobile dopants move to the region of the semiconductive material as a result of an application of a voltage across the first and second electrodes, and the movement of the mobile dopants changes the region of the semiconductive material from being electrically insulative to electrically conductive; and
    a barrier material intermediate the semiconductive material and one of the first and second electrodes, and wherein the barrier material is impervious to the movement of the mobile dopants.

10. The memory cell of claim 9 wherein the region of the semiconductive material is configured to remain electrically conductive after the application of the voltage across the first and second electrodes has been ceased.

11. The memory cell of claim 9 wherein the barrier material is adjacent to the region of the semiconductive material.

12. The memory cell of claim 9 wherein the barrier material is electrically insulative.

13. The memory cell of claim 9 wherein a concentration of the mobile dopants in the region of the semiconductive material is increased as a result of the application of the voltage across the first and second electrodes.

14. The memory cell of claim 9 wherein the capacitor has an increased capacitance when the memory cell is in the second programmed state compared with the first programmed state.

15. A memory cell comprising:
a capacitor configured to have at least two different capacitive states corresponding to different programmed states of the memory cell, the capacitor comprising:
a first electrode;
a second electrode; and
semiconductive material intermediate the first and second electrodes; and
wherein a region of the semiconductive material is electrically insulative when the memory cell is in a first of the programmed states and electrically conductive when the memory cell is in a second of the programmed states; and
wherein the semiconductive material has different dielectric thicknesses when the memory cell is in the first and second programmed states.

16. A memory cell comprising:
a capacitor configured to have different capacitive states corresponding to different programmed states of the memory cell, the capacitor comprising:
a first electrode;
a second electrode; and
semiconductive material intermediate the first and second electrodes;
wherein the capacitor is configured to change from a first capacitance corresponding to a first of the programmed states of the memory cell to a second capacitance corresponding to a second of the programmed states of the memory cell as a result of an application of a voltage across the first and second electrodes, and wherein the first and second capacitances are different;
wherein the semiconductive material comprises a plurality of mobile dopants which move from a first region of the semiconductive material to a second region of the semiconductive material as a result of the application of the voltage across the first and second electrodes; and
a barrier material intermediate the semiconductive material and one of the first and second electrodes, and wherein the barrier material is impervious to the movement of the mobile dopants.

17. The memory cell of claim 16 wherein a region of the semiconductive material is electrically insulative when the memory cell is in the first programmed state and electrically conductive when the memory cell is in the second programmed state.

18. The memory cell of claim 16 wherein the capacitor is configured to retain the second capacitance after the application of the voltage has been ceased.

19. The memory cell of claim 16 wherein a concentration of the mobile dopants in the second region increases as a result of the application of the voltage across the first and second electrodes.

20. The memory cell of claim 16 wherein the barrier material is adjacent to the second region of the semiconductive material.

21. The memory cell of claim 16 wherein the barrier material is electrically insulative.

22. A memory cell comprising:
a capacitor configured to have different capacitive states corresponding to different programmed states of the memory cell, the capacitor comprising:
a first electrode;
a second electrode; and
semiconductive material intermediate the first and second electrodes;
wherein the capacitor is configured to change from a first capacitance corresponding to a first of the programmed states of the memory cell to a second capacitance corresponding to a second of the programmed states of the memory cell as a result of an application of a voltage across the first and second electrodes, and wherein the first and second capacitances are different; and
wherein the semiconductive material has different dielectric thicknesses when the memory cell is in the first and second programmed states.

23. A memory cell programming method comprising:
first applying a first voltage across a memory cell comprising a first electrically conductive region, a second electrically conductive region, and an electrically insulative region between the first and second electrically conductive regions;
wherein the first applying increases a thickness of one of the first and second electrically conductive regions in a direction towards the other of the first and second electrically conductive regions and the first applying changes the memory cell from a first programmed state to a second programmed state;
second applying a second voltage across the memory cell after the first applying; and
wherein the second applying decreases the thickness of the one of the first and second electrically conductive regions and the second applying changes the memory cell from the second programmed state to the first programmed state.

24. The method of claim 23 wherein the first applying changes a region of semiconductive material between the first and second electrically conductive regions from being electrically insulative to electrically conductive.

25. The method of claim 23 wherein the first applying changes a dielectric thickness of a semiconductive material between the first and second electrically conductive regions.

26. The method of claim 23 wherein the first and second applyings individually cause a plurality of mobile dopants to move between different regions of semiconductive material between the first and second electrically conductive regions.

27. The method of claim 23 wherein the first applying changes a capacitance of the memory cell from a first capacitive state corresponding to the first programmed state to a second capacitive state corresponding to the second programmed state.

28. The method of claim 23 wherein the first and second applyings comprise applying the first and second voltages having opposite polarities across the memory cell.

* * * * *